(12) United States Patent
Moorthy et al.

(10) Patent No.: US 10,362,656 B2
(45) Date of Patent: Jul. 23, 2019

(54) LOAD CONTROL DEVICE HAVING AN OVERCURRENT PROTECTION CIRCUIT

(71) Applicant: Lutron Technology Company LLC, Coopersburg, PA (US)

(72) Inventors: Dinesh Sundara Moorthy, Allentown, PA (US); James P. Steiner, Royersford, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 16/003,909

(22) Filed: Jun. 8, 2018

(65) Prior Publication Data

US 2018/0359835 A1 Dec. 13, 2018

Related U.S. Application Data

(60) Provisional application No. 62/517,484, filed on Jun. 9, 2017.

(51) Int. Cl.
*H05B 33/08* (2006.01)
*H02M 1/08* (2006.01)
(Continued)

(52) U.S. Cl.
CPC ........ *H05B 33/0887* (2013.01); *H02M 1/081* (2013.01); *H02M 1/32* (2013.01);
(Continued)

(58) Field of Classification Search
CPC .... H05B 37/02; H05B 33/08; H05B 33/0815; H05B 33/0818; H05B 33/0887;
(Continued)

(56) References Cited

U.S. PATENT DOCUMENTS 5,004,969 A * 4/1991 Schanin .................. G05F 1/455
323/235
5,239,255 A * 8/1993 Schanin .................. G05F 1/455
323/237
(Continued)

FOREIGN PATENT DOCUMENTS

GB 2418082 A 3/2006
WO 2009036517 A1 3/2009

*Primary Examiner* — Thai Pham
(74) *Attorney, Agent, or Firm* — Philip Smith; Amy Yanek; Glen Farbanish

(57) ABSTRACT

A load control device for controlling power delivered from an alternating-current power source to an electrical load may comprise a controllably conductive device, a control circuit, and an overcurrent protection circuit that is configured to be disabled when the controllably conductive device is non-conductive. The control circuit may be configured to control the controllably conductive device to be non-conductive at the beginning of each half-cycle of the AC power source and to render the controllably conductive device conductive at a firing time during each half-cycle (e.g., using a forward phase-control dimming technique). The overcurrent protection circuit may be configured to render the controllably conductive device non-conductive in the event of an overcurrent condition in the controllably conductive device. The overcurrent protection circuit may be disabled when the controllably conductive device is non-conductive and enabled after the firing time when the controllably conductive device is rendered conductive during each half-cycle.

20 Claims, 3 Drawing Sheets

(51) Int. Cl.
*H02M 1/32* (2007.01)
*H02M 7/12* (2006.01)
*H02M 7/217* (2006.01)
*H03K 17/16* (2006.01)
*H05B 39/04* (2006.01)

(52) U.S. Cl.
CPC ........... *H02M 7/125* (2013.01); *H02M 7/217* (2013.01); *H03K 17/168* (2013.01); *H05B 33/0818* (2013.01); *H05B 39/044* (2013.01)

(58) Field of Classification Search
CPC ...... H05B 39/04; H05B 39/048; H05B 39/06; H02M 1/08; H02M 1/081; H02M 5/293; H02M 2005/2935; H02M 7/12; H02M 7/125; H02M 1/0818
See application file for complete search history.

(56) References Cited

U.S. PATENT DOCUMENTS

| | | | |
|---|---|---|---|
| 6,347,028 B1 | 2/2002 | Hausman, Jr. et al. | |
| 6,646,843 B1* | 11/2003 | Newman, Jr. | H05B 39/048 361/65 |
| 6,969,959 B2* | 11/2005 | Black | H02M 5/293 315/116 |
| 7,190,124 B2 | 3/2007 | Kumar et al. | |
| 7,242,150 B2 | 7/2007 | DeJonge et al. | |
| 7,245,116 B2* | 7/2007 | Tateno | H02M 3/1588 323/314 |
| 7,358,627 B2 | 4/2008 | Black et al. | |
| 7,928,703 B2* | 4/2011 | Tan | H02M 7/53803 323/224 |
| 7,940,505 B1* | 5/2011 | Sadate | H03K 17/0822 361/103 |
| 8,664,881 B2 | 3/2014 | Newman, Jr. et al. | |
| 8,729,814 B2 | 5/2014 | Salvestrini | |
| 8,957,662 B2 | 2/2015 | Newman, Jr. et al. | |
| 9,160,224 B2 | 10/2015 | Newman, Jr. et al. | |
| 9,418,809 B2 | 8/2016 | Hausman, Jr. et al. | |
| 2003/0197995 A1* | 10/2003 | Hua | H02M 5/293 361/100 |
| 2009/0034302 A1* | 2/2009 | Cannella | H02M 1/32 363/56.1 |
| 2010/0014949 A1* | 1/2010 | Liu | B66D 1/26 414/222.11 |
| 2011/0101878 A1* | 5/2011 | Huber | H05B 37/0209 315/224 |
| 2014/0126261 A1 | 5/2014 | Newman, Jr. et al. | |

* cited by examiner

LOAD CONTROL DEVICE HAVING AN OVERCURRENT PROTECTION CIRCUIT

CROSS-REFERENCE TO RELATED APPLICATIONS

This application claims priority to U.S. Provisional Patent Application No. 62/517,484, filed Jun. 9, 2017, the entire disclosure of which is incorporated by reference herein.

BACKGROUND

Prior art load control devices, such as dimmer switches, may be coupled in series electrical connection between an alternating-current (AC) power source and a lighting load for controlling the amount of power delivered from the AC power source to the lighting load. A standard dimmer switch may typically comprise a bidirectional semiconductor switch, e.g., a thyristor (e.g., such as a triac) or two field-effect transistors (FETs) in anti-series connection. The bidirectional semiconductor switch may be coupled in series between the AC power source and the load and is controlled to be conductive and non-conductive for portions of a half cycle of the AC power source to thus control the amount of power delivered to the electrical load. Generally, dimmer switches may use either a forward phase-control dimming technique or a reverse phase-control dimming technique in order to control when the bidirectional semiconductor switch is rendered conductive and non-conductive to thus control the power delivered to the load. The dimmer switch may comprise a toggle actuator for turning the lighting load on and off and an intensity adjustment actuator for adjusting the intensity of the lighting load. Examples of prior art dimmer switches are described in greater detail is commonly-assigned U.S. Pat. No. 5,248,919, issued Sep. 29, 1993, entitled LIGHTING CONTROL DEVICE; and U.S. Pat. No. 6,969,959, issued Nov. 29, 2005, entitled ELECTRONIC CONTROL SYSTEMS AND METHODS; the entire disclosures of which are incorporated by reference herein.

In order to save energy, high-efficiency lighting loads, such as, for example, light-emitting diode (LED) light sources, are being used in place of or as replacements for conventional incandescent or halogen lamps. High-efficiency light sources typically consume less power and provide longer operational lives as compared to incandescent and halogen lamps. In order to illuminate properly, a load regulation circuit (e.g., such as an electronic dimming ballast or an LED driver) may be coupled between the AC power source and the respective high-efficiency light source (e.g., the compact fluorescent lamp or the LED light source) for regulating the power supplied to the high-efficiency light source. Some high-efficiency lighting loads may be integrally housed with the load regulation circuit in a single enclosure. Such an enclosure may have a screw-in base that allows for mechanical attachment to standard Edison sockets and provide electrical connections to the neutral side of the AC power source and either the hot side of the AC power source or the dimmed-hot terminal of the dimmer switch (e.g., for receipt of the phase-control voltage).

A dimmer switch for controlling a high-efficiency light source may be coupled in series between the AC power source and the load regulation circuit for the high-efficiency light source. The load regulation circuit may control the intensity of the high-efficiency light source to the desired intensity in response to the conduction time of the bidirectional semiconductor switch of the dimmer switch. The load regulation circuits for the high-efficiency light sources may have high input impedances or input impedances that vary in magnitude throughout a half cycle. When a prior-art forward phase-control dimmer switch is coupled between the AC power source and the load regulation circuit for the high-efficiency light source, the load regulation circuit may not be able to conduct enough current to exceed the rated latching and/or holding currents of the thyristor.

SUMMARY

As described herein, a load control device for controlling power delivered from an alternating-current (AC) power source to an electrical load may comprise a controllably conductive device, a control circuit, and an overcurrent protection circuit that is configured to be disabled when the controllably conductive device is non-conductive. The controllably conductive device may be adapted to be coupled between the AC power source and the electrical load for controlling the power delivered to the electrical load. For example, the controllably conductive device may comprise two field-effect transistors (FETs) coupled in anti-series connection. The control circuit may be configured to control the controllably conductive device using a forward phase-control dimming technique. The control circuit may control the controllably conductive device to be non-conductive at the beginning of each half-cycle of the AC power source and to render the controllably conductive device conductive at a firing time during each half-cycle. The overcurrent protection circuit may be coupled to the controllably conductive device and may render the controllably conductive device non-conductive in the event of an overcurrent condition in the controllably conductive device. The overcurrent protection circuit may be disabled when the controllably conductive device is non-conductive and enabled after the firing time when the controllably conductive device is rendered conductive during each half-cycle.

In addition, a method of controlling power delivered from an alternating-current (AC) power source to an electrical load is also disclosed herein. The method may comprise: (1) controlling a controllably conductive device using a forward phase-control technique to conduct a load current through the electrical load to control the power delivered to the electrical load; (2) controlling the controllably conductive device to be non-conductive at the beginning of each half-cycle of the AC power source; (3) disabling an overcurrent protection circuit when the controllably conductive device is non-conductive during each half-cycle, the overcurrent protection circuit coupled to the controllably conductive device and responsive to the magnitude of the load current; (4) rendering the controllably conductive device conductive at a firing time during each half-cycle; and (5) enabling the overcurrent protection circuit after the firing time when the controllably conductive device is rendered conductive during each half-cycle to allow the overcurrent protection circuit to render the controllably conductive device non-conductive in the event of an overcurrent condition in the controllably conductive device.

DETAILED DESCRIPTION

Figure 1:
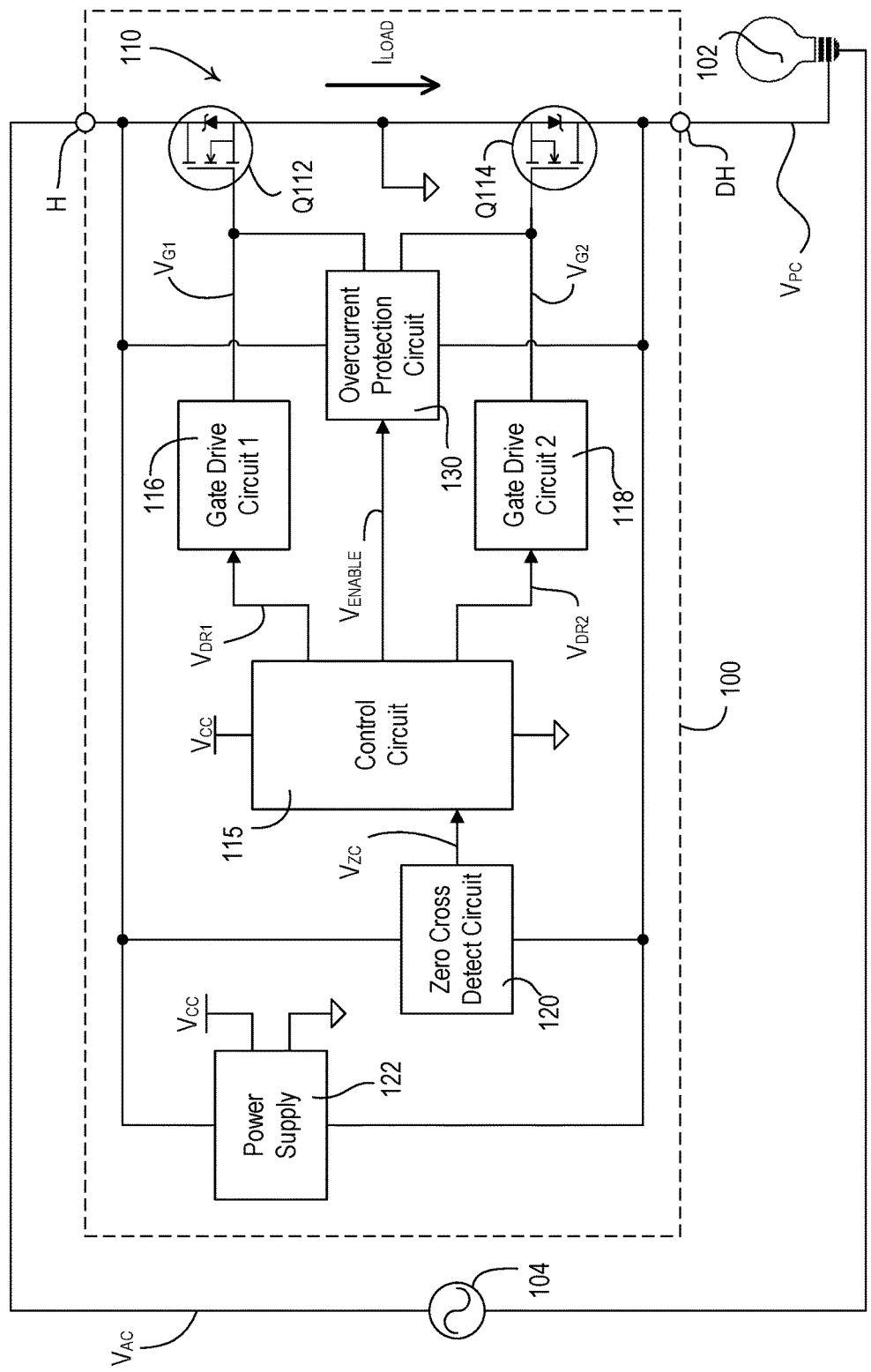
FIG. 1 is a simplified block diagram of an example load control device (e.g., a dimmer switch) for controlling the amount of power delivered to an electrical load, such as, a lighting load.

FIG. 1 is a simplified block diagram of an example load control device 100 (e.g., a dimmer switch) for controlling the amount of power delivered to an electrical load, such as, a lighting load 102. The load control device 100 may have a hot terminal H coupled to an alternating-current (AC) power source 104 for receiving an AC mains line voltage $V_{AC}$, and a dimmed-hot terminal DH coupled to the lighting load 102.

The load control device 100 may comprise a controllably conductive device 110, such as two field-effect transistors (FETs) Q112, Q114 that may be coupled in anti-series connection between the hot terminal and the dimmed-hot terminal DH. The junction of the FETs may be coupled to circuit common. The load control device 100 may comprise a control circuit 115, e.g., a digital control circuit, for controlling the FETs Q112, Q114 to conduct a load current $I_{LOAD}$ through the lighting load 102. The control circuit 115 may include one or more of a processor (e.g., a microprocessor), a microcontroller, a programmable logic device (PLD), a field programmable gate array (FPGA), an application specific integrated circuit (ASIC), or any suitable controller or processing device. The control circuit 115 may generate first and second drive signals $V_{DR1}$, $V_{DR2}$ that may be coupled to the gates of the respective FETs Q112, Q114 via first and second gate drive circuits 116, 118, respectively, for generating gate voltages $V_{G1}$, $V_{G2}$ at the gates of the FETs. For example, the first and second gate voltages $V_{G1}$, $V_{G2}$ may be the inverse of the respective drive signals $V_{DR1}$, $V_{DR2}$. When the controllably conductive device 110 is rendered conductive during the positive half-cycles of the AC power source 104, the load current $I_{LOAD}$ may be conducted through the drain-source channel of the first FET Q112 and the body diode of the second FET Q114. When the controllably conductive device 110 is rendered conductive during the negative half-cycles of the AC power source 104, the load current $I_{LOAD}$ may be conducted through the drain-source channel of the second FET Q114 and the body diode of the first FET Q112.

The control circuit 115 may receive a zero-cross control signal $V_{ZC}$ representative of the zero-crossing points of the AC main line voltage of the AC power source 104 from a zero-cross detect circuit 120. The control circuit 115 may be configured to render the FETs Q112, Q114 conductive and/or non-conductive at predetermined times (e.g., at a firing time or firing angle) relative to the zero-crossing points of the AC waveform to generate a phase-control voltage $V_{PC}$ using a phase-control dimming technique (e.g., a forward phase-control dimming technique and/or a reverse phase-control dimming technique). Examples of dimmers are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are incorporated by reference herein.

The load control device 100 may include a power supply 122. The power supply 122 may generate a direct-current (DC) supply voltage $V_{CC}$ for powering the control circuit 115 and the other low-voltage circuitry of the load control device 100. The power supply 100 may be coupled in parallel with the series combination of the FETs Q112, Q114. The power supply 122 may be configured to conduct a charging current through the lighting load 102 to generate the DC supply voltage $V_{CC}$.

The load control device 100 may further comprise an overcurrent protection circuit 130 that may be coupled across the series combination of the FETs Q112, Q114 for receiving the voltage developed across the FETs. The voltage developed across the series combination of the FETs Q112, Q114 may be a function of the magnitude of the load current $I_{LOAD}$ and an on resistance $R_{DS-ON}$ of the conducting FET as well as the forward voltage drop of the body diode of the non-conducting FET. Thus, the voltage developed across the controllably conductive device 110 (e.g., across the series combination of the FETs Q112, Q114) may be representative of the magnitude of the load current $I_{LOAD}$. The overcurrent protection circuit 130 may be responsive to the magnitude of the load current $I_{LOAD}$ (e.g., responsive to the magnitude of the voltage developed across the controllably conductive device 110, which may indicate the magnitude of the load current $I_{LOAD}$). The overcurrent protection circuit 130 may be electrically coupled to the gates of the FETs Q112, Q114 for controlling the FETs Q112, Q114 in the event of an overcurrent condition. For example, the overcurrent protection circuit 130 may be configured to control the magnitude of the gate voltages $V_{G1}$, $V_{G2}$ to approximately zero volts by shorting gates of the respective FET Q112, Q114 to circuit common.

The control circuit 115 may be coupled to the overcurrent protection circuit 130 for enabling and disabling the overcurrent protection circuit 130. For example, the control circuit 115 may generate an enable control signal $V_{ENABLE}$ for enabling and disabling the overcurrent protection circuit 130. When the control circuit 115 is controlling the FETs Q112, Q114 using the forward phase-control dimming technique, the control circuit 115 may be configured to disable the overcurrent protection circuit 130 while the controllably conductive device 110 is non-conductive during each half-cycle of the AC power source 104 (e.g., when one of the FETs Q112, Q114 is rendered non-conductive to block the flow of the load current $I_{LOAD}$). The overcurrent protection circuit 130 may be disabled while the controllably conductive device 110 is non-conductive during each half-cycle to prevent the overcurrent protection circuit 130 from tripping when the controllably conductive device 110 is rendered conductive during each half-cycle (e.g., at the firing time or firing angle). After control circuit 115 control one of the FETs Q112, Q114 to render the controllably conductive device 100 conductive, the magnitude of the phase-control voltage $V_{PC}$ may transition from approximately zero volts to approximately the magnitude of the AC mains line voltage $V_{AC}$ over a switching time period (e.g., a rise time period and/or a turn-on time period). In addition, the control circuit 115 may be configured to delay enabling the overcurrent protection circuit 130 for a delay time period after the time at which one of the FETs Q112, Q114 is controlled to render the controllably conductive device 110 conductive during each half-cycle, for example, to allow the FET to become fully conductive during the switching time period.

While the two FETs Q112, Q114 are shown in FIG. 1, the two FETs may be replaced by a single FET in a full-wave rectifier bridge. In such an implementation, the control circuit 115 may generate a single drive voltage for producing a single gate voltage at the gate of the FET in the bridge. The overcurrent protection circuit 130 may be coupled across the FET in the bridge and would be responsive to the voltage across the FET and thus the current conducted through the FET. The overcurrent protection circuit 130 may be configured to remove the gate voltage from the gate of the FET in the event of an overcurrent condition. The control circuit 115 would be configured to disable the overcurrent protection circuit when the FET is non-conductive during each half-cycle in a similar manner as described above.

Figure 2:
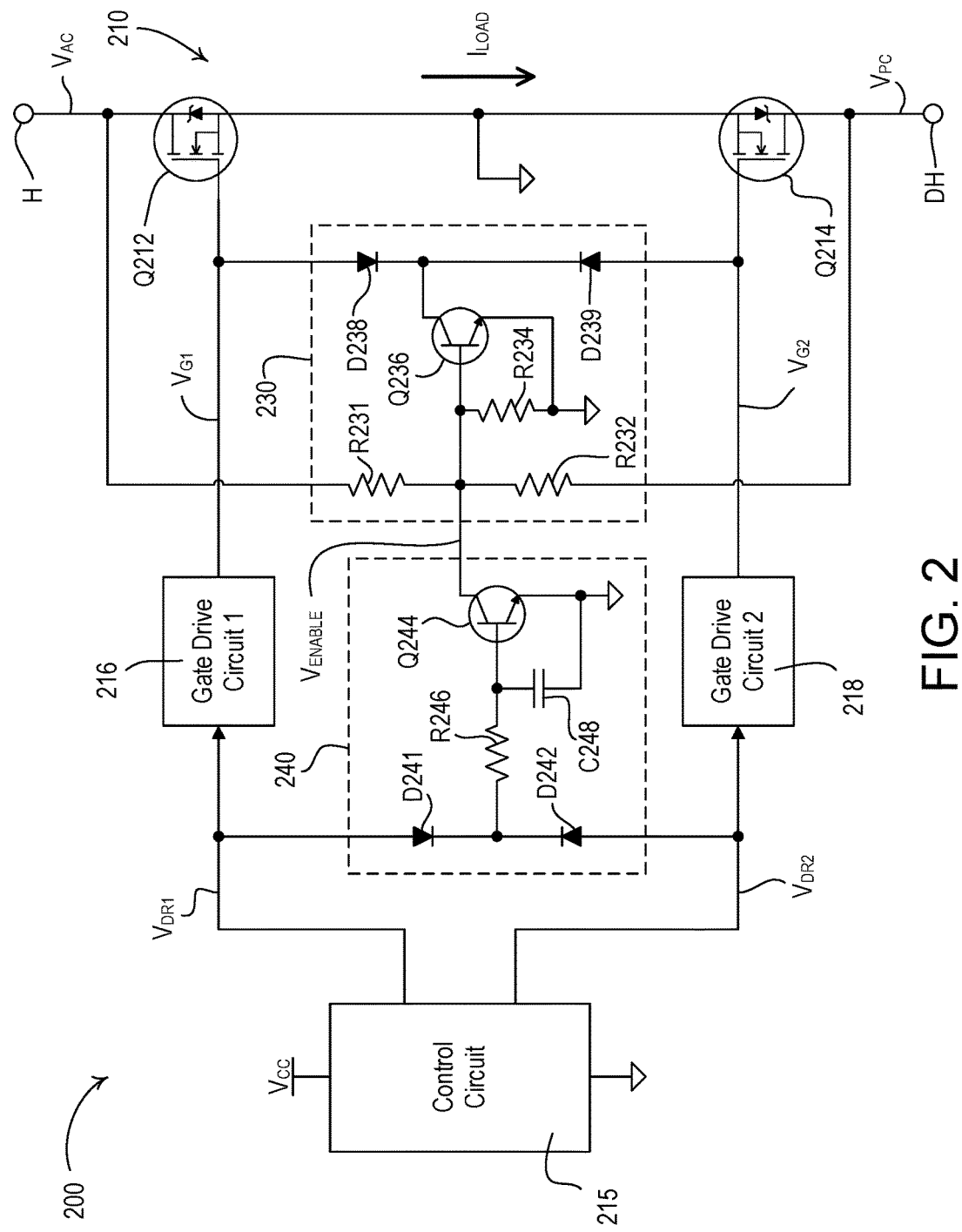
FIG. 2 is a simplified schematic diagram of another example load control device showing an overcurrent protection circuit and an override circuit.
Figure 3:
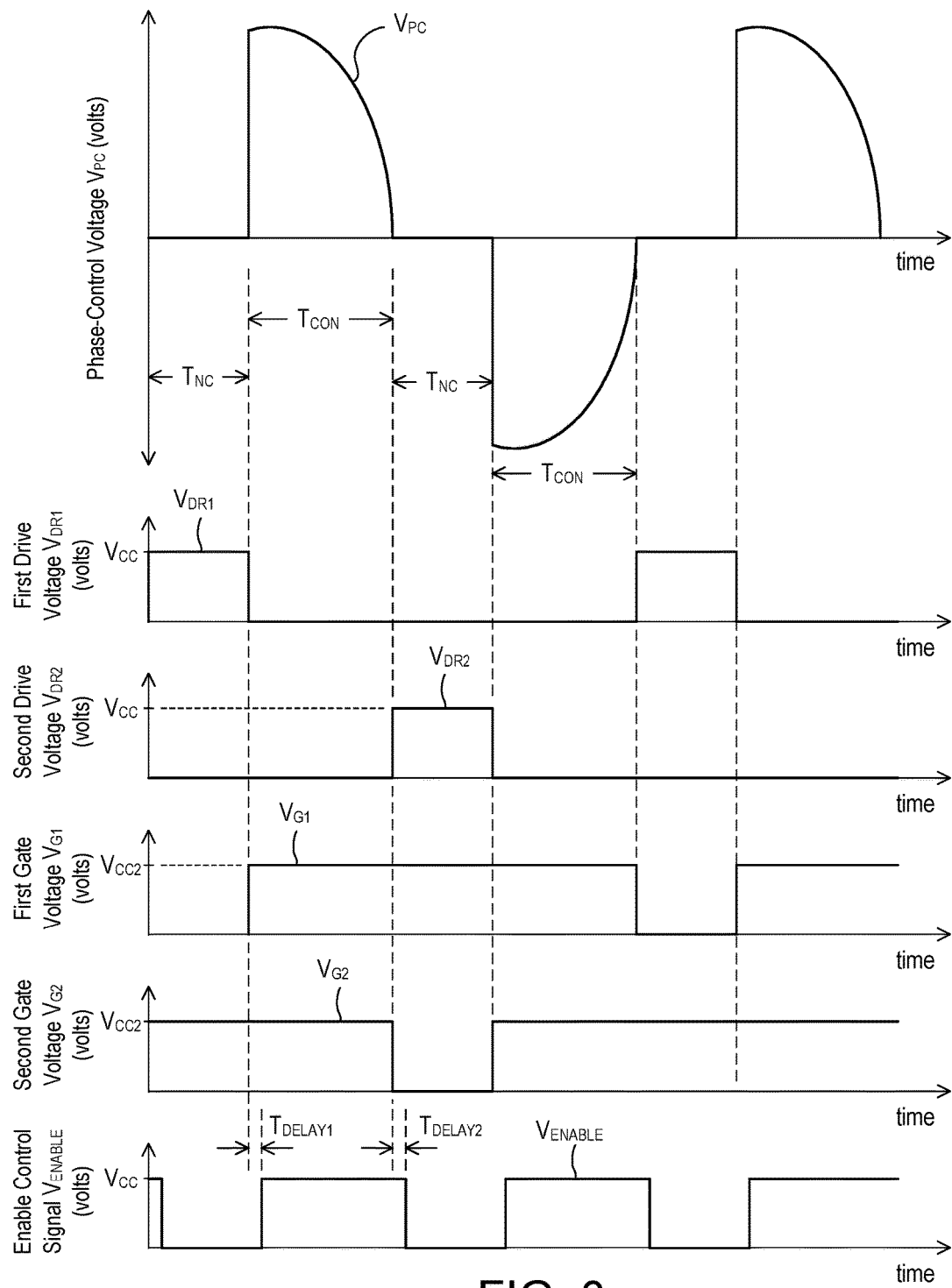
FIG. 3 shows simplified waveforms that illustrate the operation of the load control device of FIG. 2.

FIG. 2 is a simplified schematic diagram of another example load control device 200 (e.g., the load control device 100 shown in FIG. 1) for controlling the amount of power delivered to an electrical load, such as a lighting load (e.g., the lighting load 102). FIG. 3 shows simplified waveforms that illustrate the operation of the load control device 200. The load control device 200 may comprise a controllably conductive device 210, for example, including two FETs Q212, Q214 coupled in anti-series connection between a hot terminal H (e.g., that may be coupled to an AC power source) and a dimmed-hot terminal DH (e.g., that may be coupled to the lighting load). The junction of the FETs Q212, Q214 may be coupled to circuit common. The load control device 200 may comprise a control circuit 215 (e.g., a digital control circuit) configured to control the FETs Q212, Q214 using a forward phase-control dimming technique to generate a phase-control voltage $V_{PC}$ to be provided to the lighting load (e.g., a forward phase-control voltage as shown in FIG. 3) and conduct a load current $I_{LOAD}$ through the lighting load. The control circuit 215 may include one or more of a processor (e.g., a microprocessor), a microcontroller, a programmable logic device (PLD), a field programmable gate array (FPGA), an application specific integrated circuit (ASIC), or any suitable controller or processing device. The control circuit 215 may be powered from a first supply voltage $V_{CC}$ (e.g., approximately 3.3 volts or 5 volts), which may be generated by a power supply of the load control device 200 (e.g., the power supply 122 shown in FIG. 1).

The control circuit 215 may generate first and second drive signals $V_{DR1}$, $V_{DR2}$ for controlling the magnitude of the phase-control voltage to be approximately equal to zero volts for a non-conduction time period $T_{NC}$ at the beginning of each half-cycle and approximately equal to the magnitude of the AC line voltage for a conduction time period $T_{CON}$ at the end of each half-cycle. The control circuit 215 may be configured to drive the first drive signal $V_{DR1}$ high (e.g., towards the first supply voltage $V_{CC}$) to render the first FET Q212 non-conductive for the non-conductive time period $T_{NC}$ during the positive half-cycles, and to drive the second drive signal $V_{DR2}$ high (e.g., towards the first supply voltage $V_{CC}$) to render the first FET Q212 non-conductive for the non-conductive time period $T_{NC}$ during the negative half-cycles (e.g., as shown in FIG. 3). The first and second drive signals $V_{DR1}$, $V_{DR2}$ may be coupled to the gates of the respective FETs Q212, Q214 via first and second gate drive circuits 216, 218, respectively, for generating gate voltages $V_{G1}$, $V_{G2}$. The first and second gate drive circuits 216, 218 may pull the gates of the respective FETs Q212, Q214 up towards a second supply voltage $V_{CC2}$ (e.g., approximately 12 volts) when the respective drive signals $V_{DR1}$, $V_{DR2}$ is driven low towards circuit common as shown in FIG. 3). The FETs Q212, Q214 may be rendered conductive when the gate voltages $V_{G1}$, $V_{G2}$ are driven above rated gate threshold voltages of the FETs.

The load control device 200 may further comprise an overcurrent protection circuit 230 that may be coupled across the series combination of the FETs Q212, Q214 for receiving the voltage developed across the FETs. The overcurrent protection circuit 230 may comprise two resistors R231, R232 that may be coupled across the series combination of the FETs Q212, Q214. The junction of the resistors R231, R232 may be coupled to circuit common through a sense resistor R234, such that the series combination of the first resistor R231 and the sense resistor R234 may be coupled in parallel with the drain-source junction of the first FET Q212 and the series combination of the second resistor R232 and the sense resistor R234 may be coupled in parallel with the drain-source junction of the second FET Q214. The sense resistor R234 may be coupled across the base-emitter junction of a transistor Q236, e.g., an NPN bipolar junction transistor (BJT). The collector of the transistor Q236 may be coupled to the gate of the first FET Q212 through a diode D238 and to the gate of the second FET Q214 through a diode D239.

In the event of an overcurrent condition (e.g., if the magnitude of the load current $I_{LOAD}$ exceeds an overcurrent threshold) while the controllably conductive device 210 is conductive, the overcurrent protection circuit 230 may render the FETs Q212, Q214 non-conductive. For example, the overcurrent protection circuit 230 may render the controllably conductive device 210 non-conductive, for example, by controlling the magnitude of the gate voltages $V_{G1}$, $V_{G2}$ towards circuit common (e.g., to a voltage less than the rated gate threshold voltages of the FETs) to render both of the FETs non-conductive. The overcurrent threshold may be set such that the overcurrent protection circuit 230 does not render the FETs Q212, Q214 non-conductive during normal operation (e.g., even during the conduction of an inrush current when the lighting load is first turned on). For example, the overcurrent threshold may be set such that the overcurrent protection circuit 230 renders the FETs Q212, Q214 non-conductive if the magnitude of the load current $I_{LOAD}$ exceeds approximately 70 amps. In addition, the overcurrent protection circuit 230 may generate an overcurrent feedback signal, which may indicate an overcurrent condition and may be received by the control circuit 215, and the control circuit may be configured to control gate voltages $V_{G1}$, $V_{G2}$ to render the FETs Q212, Q214 non-conductive in response to the overcurrent feedback signal.

When the first FET Q212 is rendered conductive, the overcurrent protection circuit 230 may render both FETs non-conductive Q212, Q214 if the magnitude of the load current $I_{LOAD}$ conducted through the first FET Q212 exceeds the overcurrent threshold. The voltage developed across the series combination of the first resistor R231 and the sense resistor R234 may be a function of the magnitude of the load current $I_{LOAD}$ and an on resistance $R_{DS-ON1}$ of the first FET Q212 when the drain-source channel of the first FET Q212 is conducting the load current $I_{LOAD}$. When the magnitude of the load current $I_{LOAD}$ increases during an overcurrent condition, the voltage developed across the first FET Q212 due to the on resistance $R_{DS-ON1}$ may increase significantly. Because the body diode of the second FET Q214 is coupled across the second resistor R232 and the sense resistor R234, the voltage developed across the second FET Q214 during the overcurrent condition does not appreciably affect the voltage developed across the sense resistor R236. When the magnitude of the load current $I_{LOAD}$ exceeds the overcurrent threshold, the voltage across the sense resistor R234 may exceed a rated base-emitter voltage of the transistor Q236, which may render the transistor Q236 conductive. Accordingly, the gate of the first FET Q212 may be pulled down towards circuit common through the first diode D238 and the transistor Q236, thus rendering the first FET Q212 non-conductive. Since the first FET Q212 is non-conductive, the voltage developed across the FETs Q212, Q214 may be approximately equal to the AC mains line voltage $V_{AC}$, which may maintain the transistor Q236 conductive and the first FET Q212 non-conductive (e.g., until the magnitude of the AC mains line voltage $V_{AC}$ drops to zero volts at the next zero-crossing).

The overcurrent protection circuit 230 may operate in a similar manner in response to an overcurrent condition in the second FET Q214. The voltage developed across the series combination of the second resistor R232 and the sense resistor R234 may be a function of the magnitude of the load current $I_{LOAD}$ and an on resistance $R_{DS-ON2}$ of the second FET Q214 when the drain-source channel of the second FET Q214 is conducting the load current $I_{LOAD}$. When the magnitude of the load current $I_{LOAD}$ exceeds the overcurrent threshold, the voltage developed across the second FET Q214 due to the on resistance $R_{DS-ON2}$ may increase significantly, which may cause the voltage across the sense resistor R234 to exceed the rated base-emitter voltage of the transistor Q236 and cause the transistor Q236 to be rendered conductive. The gate of the second FET Q214 may be pulled down towards circuit common through the second diode D239 and the transistor Q236, thus rendering the second FET Q214 non-conductive. Since the second FET Q214 is non-conductive, the voltage developed across the FETs Q212, Q214 may be approximately equal to the AC mains line voltage $V_{AC}$, which may maintain the transistor Q236 conductive and the second FET Q214 non-conductive (e.g., until the magnitude of the AC mains line voltage $V_{AC}$ drops to zero volts at the next zero-crossing).

The control circuit 215 may be coupled to the overcurrent protection circuit 230 through an override circuit 240 for enabling and disabling the overcurrent protection circuit 230. The override circuit 240 may receive the first and second drive signals $V_{DR1}$, $V_{DR2}$ and may generate an enable control signal $V_{ENABLE}$ for enabling and disabling the overcurrent protection circuit 230. The override circuit 240 may comprise two diodes D241, D242 having anodes coupled to receive the first and second drive signals $V_{DR1}$, $V_{DR2}$, respectively, and cathodes coupled together. The junction of the diodes D241, D242 may be coupled to a base of a transistor Q244 (e.g., an NPN bipolar junction transistor) through a resistor-capacitor (RC) circuit having a resistor R246 and a capacitor R248. The enable control signal $V_{ENABLE}$ may be generated at the collector of the transistor Q244, which may be coupled to the base of the transistor Q236 of the overcurrent protection circuit 230. In addition, the control circuit 215 may generate the enable control signal $V_{ENABLE}$ (e.g., at an output pin), such that the override circuit 240 may not be required.

When the first drive signal $V_{DR1}$ or the second drive signal $V_{DR2}$ is driven high towards the supply voltage $V_{CC}$, the capacitor C248 may charge through the respective diode D241, D242 and the resistor R246. When the voltage across the capacitor C248 exceeds the rated base-emitter voltage of the transistor Q244, the transistor may be rendered conductive, thus pulling the enable control signal $V_{ENABLE}$ down towards circuit common. When the enable control signal $V_{ENABLE}$ is low, the transistor Q236 of the overcurrent protection circuit 230 is prevented from being rendered conductive, thus disabling the overcurrent protection circuit. Since the first and second drive signals $V_{DR1}$, $V_{DR2}$ are driven high to render the respective FET Q212, Q214 non-conductive, the overcurrent protection circuit 230 is disabled when the FETs Q212, Q214 are non-conductive.

When one of the first and second drive signals $V_{DR1}$, $V_{DR2}$ is driven low to render the respective FET Q212, Q214 conductive, the overcurrent protection circuit 230 may be enabled after a first delay period $T_{DELAY1}$ from when the respective drive signal is driven low (e.g., as shown in FIG. 3). For example, the RC circuit of the override circuit 240 may provide the first delay period $T_{DELAY1}$ (e.g., the time required for the capacitor C248 to discharge to a point where the voltage across the base-emitter junction of the transistor Q244 drops below the rated base-emitter voltage). The first delay period $T_{DELAY1}$ may be, for example, approximately 60 microseconds, which may be longer than a switching time period of the FETs Q212, Q214. Similarly, the overcurrent protection circuit 230 may be disabled after a second delay period $T_{DELAY2}$ (e.g., approximately 60 microseconds) from when one of the first and second drive signals $V_{DR1}$, $V_{DR2}$ is driven high to render the respective FET Q212, Q214 non-conductive.

If the control circuit 215 were to leave the overcurrent protection circuit 230 enabled when the controllably conductive device 210 is non-conductive (e.g., when one or both of the FETs Q212, Q214 are non-conductive) at the beginning of each half-cycle, the voltage developed across the controllably conductive device may be approximately equal to the AC mains line voltage $V_{AC}$, which may cause the overcurrent protection circuit 230 to pull the gate voltages $V_{G1}$, $V_{G2}$ at the gates of the respective FETs Q212, Q214 down toward circuit common. As a result, the control circuit 215 would not be able to drive the gate voltages $V_{G1}$, $V_{G2}$ above the rated gate threshold voltages of the FETs Q212, Q214, and thus would not be able to render the FETs Q212, Q214 conductive at the firing time. Accordingly, the control circuit 215 may be configured to disable the overcurrent protection circuit 230 while the controllably conductive device 210 is non-conductive to prevent the overcurrent protection circuit 230 from controlling the gate voltages $V_{G1}$, $V_{G2}$ of the FETs Q212, Q214 until after the controllably conductive device is rendered conductive at the firing time each half-cycle (e.g., until after the first delay period $T_{DELAY1}$).

What is claimed is:

1. A load control device for controlling power delivered from an alternating-current (AC) power source to an electrical load, the load control device comprising:
 a controllably conductive device adapted to be coupled between the AC power source and the electrical load for conducting a load current through the electrical load to control the power delivered to the electrical load;
 a control circuit configured to control the controllably conductive device using a forward phase-control dimming technique, the control circuit configured to control the controllably conductive device to be non-conductive at the beginning of each half-cycle of the AC power source and to render the controllably conductive device conductive at a firing time during each half-cycle; and
 an overcurrent protection circuit coupled to the controllably conductive device and configured to render the controllably conductive device non-conductive in the event of an overcurrent condition in the controllably conductive device;
 wherein the overcurrent protection circuit is configured to receive an enable control signal for disabling the overcurrent protection circuit when the controllably conductive device is non-conductive and enabling the overcurrent protection circuit after the firing time when the controllably conductive device is rendered conductive during each half-cycle.

2. The load control device of claim 1, wherein the controllably conductive device comprises first and second field-effect transistors (FETs) electrically coupled in anti-series connection.

3. The load control device of claim 2, further comprising:
a first gate drive circuit coupled to receive a first drive signal from the control circuit and generate a first gate voltage at the gate of the first FET; and
a second gate drive circuit coupled to receive a second drive signal from the control circuit and generate a second gate voltage at the gate of the second FET.

4. The load control device of claim 3, further comprising:
an override circuit configured to generate the enable control signal that is received by the overcurrent protection circuit for enabling and disabling the overcurrent protection circuit.

5. The load control device of claim 4, wherein the override circuit is configured to receive the drive signals from the control circuit and to disable the overcurrent protection circuit when at least one of the FETs is controlled to be non-conductive to render the controllably conductive device non-conductive.

6. The load control device of claim 5, wherein the override circuit is configured to enable the overcurrent protection circuit after a first delay period from the firing time when at least one of the FETs is controlled to be conductive to render the controllably conductive device conductive during each half-cycle.

7. The load control device of claim 6, wherein the override circuit is configured to disable the overcurrent protection circuit after a second delay period from a time at which the at least one of the FET is controlled to be non-conductive to render the controllably conductive device non-conductive during each half-cycle.

8. The load control device of claim 3, wherein the overcurrent protection circuit is coupled to gates of the first and second FETs to control the magnitudes of the respective gate voltages to approximately zero volts to render the FETs non-conductive in the event of the overcurrent condition.

9. The load control device of claim 2, wherein the overcurrent protection circuit is coupled across the controllably conductive device and is configured to detect the overcurrent condition in response to a respective on resistance of each of the FETs.

10. The load control device of claim 1, further comprising:
an override circuit configured to generate the enable control signal that is received by the overcurrent protection circuit for enabling and disabling the overcurrent protection circuit.

11. The load control device of claim 10, wherein the override circuit is configured to enable the overcurrent protection circuit after a first delay period from the firing time when the controllably conductive device is rendered conductive during each half-cycle.

12. The load control device of claim 11, wherein the override circuit is configured to disable the overcurrent protection circuit after a second delay period from a time at which the controllably conductive device is rendered non-conductive during each half-cycle.

13. The load control device of claim 1, wherein the overcurrent protection circuit is configured to render the controllably conductive device non-conductive if the magnitude of the load current exceeds an overcurrent threshold.

14. The load control device of claim 1, wherein the control circuit is configured to generate the enable control signal that is received by the overcurrent protection circuit for enabling and disabling the overcurrent protection circuit.

15. The load control device of claim 1, wherein the controllably conductive device comprises a field-effect transistor in a full-wave rectifier bridge.

16. A method of controlling power delivered from an alternating-current (AC) power source to an electrical load, the method comprising:
controlling a controllably conductive device using a forward phase-control technique to conduct a load current through the electrical load to control the power delivered to the electrical load;
controlling the controllably conductive device to be non-conductive at the beginning of each half-cycle of the AC power source;
generating an enable control signal for enabling and disabling an overcurrent protection circuit;
controlling the enable control signal to disable the overcurrent protection circuit when the controllably conductive device is non-conductive during each half-cycle, the overcurrent protection circuit coupled to the controllably conductive device and responsive to the magnitude of the load current;
rendering the controllably conductive device conductive at a firing time during each half-cycle; and
controlling the enable control signal to enable the overcurrent protection circuit after the firing time when the controllably conductive device is rendered conductive during each half-cycle to allow the overcurrent protection circuit to render the controllably conductive device non-conductive in the event of an overcurrent condition in the controllably conductive device.

17. The method of claim 16, wherein enabling the overcurrent protection circuit further comprises enabling the overcurrent protection circuit after a first delay period from the firing time when the controllably conductive device is rendered conductive during each half-cycle.

18. The method of claim 17, wherein disabling the overcurrent protection circuit further comprises disabling the overcurrent protection circuit after a second delay period from a time at which the controllably conductive device rendered non-conductive during each half-cycle.

19. The method of claim 16, further comprising:
generating a first gate voltage at a gate of a first field-effect transistor (FET) of the controllably conductive device; and
generating a second gate voltage at a gate of a second FET of the controllably conductive device;
wherein the first and second FETs are coupled in anti-series connection.

20. The method of claim 19, further comprising:
receiving a voltage representative of a magnitude of the load current conducted through the controllably conductive device; and
rendering the controllably conductive device non-conductive when the enable control signal is controlled to enable the overcurrent protection circuit and the magnitude of the load current exceeds an overcurrent threshold.

* * * * *